United States Patent [19]

Tappan et al.

[11] Patent Number: 5,200,232
[45] Date of Patent: Apr. 6, 1993

[54] REACTION CHAMBER DESIGN AND METHOD TO MINIMIZE PARTICLE GENERATION IN CHEMICAL VAPOR DEPOSITION REACTORS

[75] Inventors: James E. Tappan, Milpitas; Arthur K. Yasuda, San Francisco; Dean R. Denison, San Jose; Randall S. Mundt, Pleasanton, all of Calif.

[73] Assignee: Lam Research Corporation, Fremont, Calif.

[21] Appl. No.: 623,090

[22] Filed: Dec. 11, 1990

[51] Int. Cl.$^5$ .................... B05D 3/06; C23C 16/00
[52] U.S. Cl. ........................ 427/569; 118/719; 118/723; 118/724; 118/725
[58] Field of Search ............. 427/38, 39, 40, 41; 156/643, 632; 118/719, 723, 724, 725, 50.1

[56] References Cited

U.S. PATENT DOCUMENTS

| | | | |
|---|---|---|---|
| 3,993,509 | 11/1976 | McGinty | 148/1.5 |
| 4,184,188 | 1/1980 | Briglia | 361/234 |
| 4,354,911 | 10/1982 | Dodd et al. | 427/304 |
| 4,384,918 | 5/1983 | Abe | 156/643 |
| 4,401,054 | 8/1983 | Matsuo et al. | 427/45.1 |
| 4,525,375 | 6/1985 | Hanak | 427/8 |
| 4,709,655 | 12/1987 | Van Mastrigt | 118/728 |
| 4,902,934 | 2/1990 | Miyamura et al. | 118/728 |
| 4,910,042 | 3/1990 | Hokynar | 427/38 |
| 4,913,929 | 4/1990 | Moslehi et al. | 427/38 |
| 4,962,727 | 10/1990 | Harada | 427/38 |
| 4,987,857 | 1/1991 | Aketagawa et al. | 118/723 |
| 4,996,077 | 2/1991 | Moslehi et al. | 427/38 |
| 5,009,920 | 4/1991 | Lee | 427/38 |
| 5,024,748 | 6/1991 | Fujimura | 204/298.38 |
| 5,027,746 | 7/1991 | Frijlink | 118/724 |
| 5,047,115 | 9/1991 | Charlet et al. | 156/643 |
| 5,080,039 | 1/1992 | Kanegae et al. | 118/725 |
| 5,094,885 | 3/1992 | Selbrede | 427/248.1 |

Primary Examiner—Marianne Padgett
Attorney, Agent, or Firm—Burns, Doane, Swecker & Mathis

[57] ABSTRACT

A method of controlling deposition quality of line-of-sight and specimen surrounding surfaces in a plasma-enhanced chemical vapor deposition apparatus. Adhesion and integrity of deposited film on the surfaces is improved by one or more of (1) avoiding differential thermal expansion of the film and the underlying surfaces, (2) controlling geometry of the surfaces to eliminate edges which generate stress in the deposited film, and (3) using material for the surface which provides strong adhesion of the deposited film. For instance, differential thermal expansion can be avoided by maintaining the surfaces at a substantially constant temperature such as ambient temperature.

12 Claims, 6 Drawing Sheets

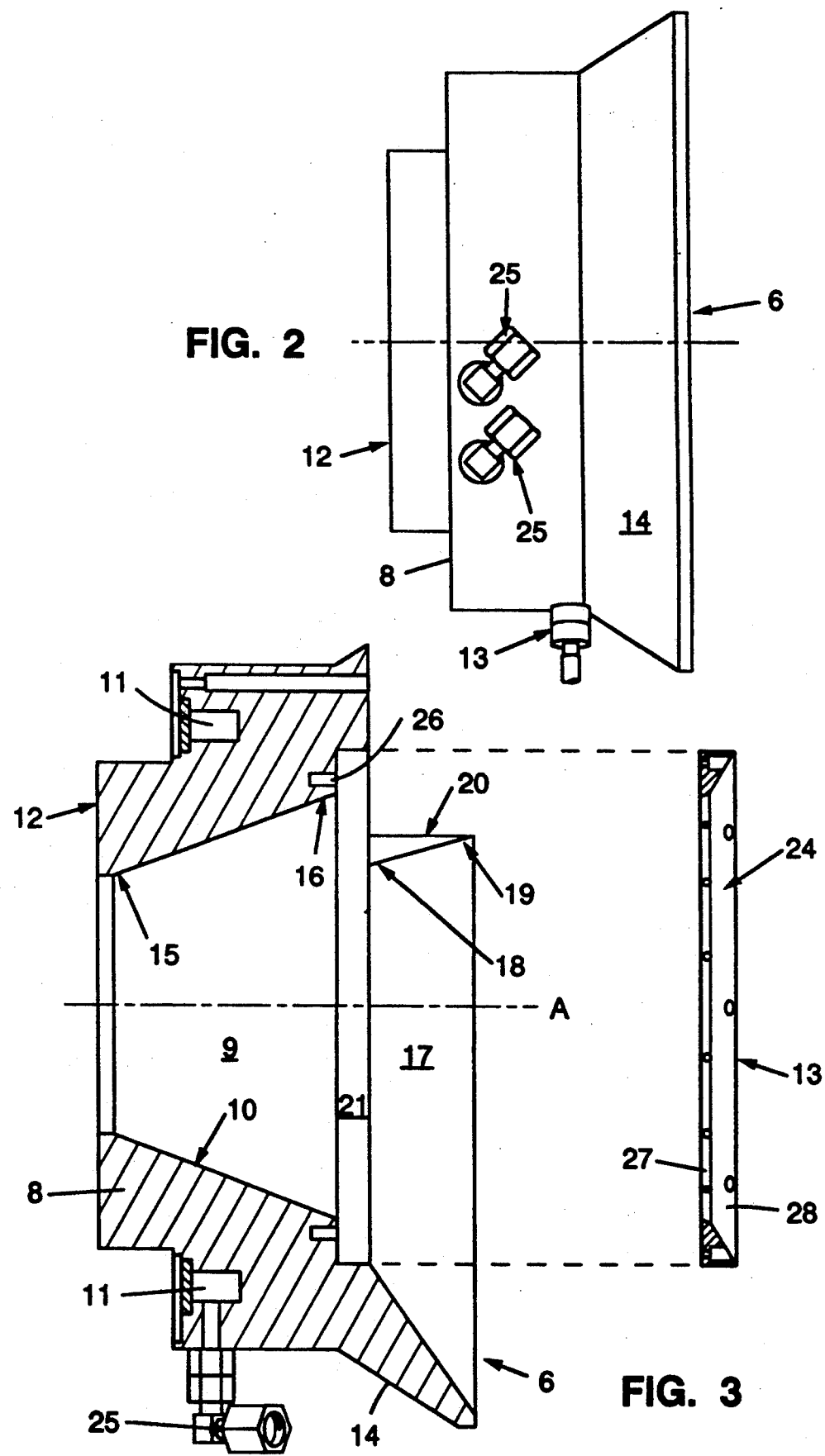

REACTION CHAMBER DESIGN AND METHOD TO MINIMIZE PARTICLE GENERATION IN CHEMICAL VAPOR DEPOSITION REACTORS

FIELD OF THE INVENTION

This invention relates to a reaction chamber design and a method for minimizing particle generation in a plasma-enhanced chemical vapor deposition (CVD) reactor.

BACKGROUND OF THE INVENTION

CVD apparatus is conventionally used to form various thin films in a semiconductor integrated circuit. Such CVD apparatus can form thin films such as $SiO_2$, $Si_3N_4$, Si or the like with high purity and high quality. In the reaction process of forming a thin film, a reaction vessel in which semiconductor substrates are arranged can be heated to a high temperature condition of 500°–1000° C. Raw material to be deposited can be supplied to the vessel in the form of gaseous constituents so that gaseous molecules are thermally dissociated and combined in the gas and on the surface of the specimen so as to form a thin film.

For instance, U.S. Pat. No. 4,962,727 ("the '727 patent") discloses a CVD apparatus in which a silicon oxide film is formed. The '727 patent points out, however, that silicon oxide molecules adhere to the inner wall surface of the vessel and that the deposit may peel off and even adhere to a wafer surface, thus causing defects in the $SiO_2$ film being formed.

A plasma-enhanced CVD apparatus utilizes a plasma reaction to create a reaction similar to that of the above-described CVD apparatus but at a relatively low temperature in order to form a thin film. The plasma CVD apparatus includes a specimen chamber, a gas introducing system, and an exhausting system. For instance, such a plasma-enhanced CVD apparatus is disclosed in U.S. Pat. No. 4,401,054, the disclosure of which is hereby incorporated by reference. Plasma is generated in such an apparatus by a microwave discharge through electron cyclotron resonance (ECR). A specimen table is provided in the specimen chamber, and plasma generated in the plasma formation chamber passes through a plasma extracting orifice so as to form a plasma stream in the specimen chamber. The specimen table may have a cooling mechanism in order to prevent a rise in temperature of the specimen due to the plasma action.

A plasma apparatus using ECR for a CVD apparatus, an etching apparatus, a sputtering apparatus or the like for manufacturing semiconductor components is disclosed in U.S. Pat. No. 4,902,934, the disclosure of which is hereby incorporated by reference. Such a plasma apparatus includes a specimen mount in a reaction chamber with electrostatic chuck means for holding a specimen (such as a silicon wafer) in good thermal contact and in a vertical orientation. The specimen mount can also be provided with cooling and heating means. In general, such reaction chambers can be operated under vacuum conditions, and the plasma generation chamber can be formed by walls which are water cooled.

Electrostatic chucking devices are disclosed in U.S. Pat. Nos. 3,993,509; 4,184,188; and 4,384,918, the disclosures of which are hereby incorporated by reference. With such systems, a specimen or wafer is typically located on a dielectric layer, and the wafer supporting surface of such electrostatic chucking arrangements can be larger or smaller than the specimen or wafer supported thereon.

The background of U.S. Pat. No. 4,709,655 ("the '655 patent") discloses that reaction chambers employed for chemical vapor deposition are generally classified as cold-wall or as hot-wall systems. The '655 patent further discloses that in the cold-wall systems, the substrate (wafer) can be heated by inductive coupling, radiant heating, or direct electrical resistance heating of internal support elements. The '655 patent states that when the wafers are mounted on a susceptible material adapted for heating by RF energy, heat is localized to the immediate semiconductor wafer area so that 1) chemical vapor deposition is limited to the heated areas, and 2) the unheated walls are below CVD temperatures thereby reducing depositions on the walls. In plasma-enhanced CVD reactors, however, deposition of a film will occur even on cold walls since heat in the plasma will cause a reaction no matter what the temperature of the reaction surface.

A problem with plasma-enhanced CVD apparatus is that deposits are formed on the wafer and all other surfaces inside the reaction chamber. The deposited film can crack and flake off, resulting in particles on the wafer. Oxide films have inherent stresses as deposited. The energy in the film increases as the film thickness increases. Differential thermal expansion between the deposited film and base material adds additional stress. Although it is known in the art to dry etch deposition surfaces in a reaction chamber, as disclosed by U.S. Pat. No. 4,910,042, there exists a need in the art for improving integrity and adhesion of deposited films to surfaces in the reaction chamber, especially line-of-sight surfaces and specimen surrounding surfaces. The term "line-of-sight surfaces" as used herein means surfaces from which a straight line can be drawn directly to a specimen mounted in the reaction chamber. The term "specimen surrounding surfaces" as used herein means surfaces surrounding the specimen mounted in the reaction chamber and which are directly contacted by a plasma stream. The term "specimen" as used herein means any semiconductor substrate, such as a wafer of silicon or other material, having a flat or uneven surface onto which a film is formed by a plasma reaction.

SUMMARY OF THE INVENTION

The invention provides a method and apparatus for minimizing particle generation in CVD reactors to thereby improve the quality of a film deposited on a specimen. In particular, the invention allows the deposition quality of line-of-sight and specimen surrounding surfaces to be controlled. By controlling the deposition quality of line-of-sight and specimen surrounding surfaces, the adhesion of a film formed thereon during a depositing step and the integrity of the film can be improved.

According to one aspect of the invention, the line-of-sight and specimen surrounding surfaces are maintained at a substantially constant temperature during the depositing step, thereby minimizing stresses in the deposited film caused by differential thermal expansion. For instance, the line-of-sight and specimen surrounding surfaces can be maintained at substantially ambient temperature whereby thermal expansion of a deposited film can be avoided even when the equipment is not in use or is being serviced. According to another aspect of the invention, the geometry of the line-of-sight and specimen surrounding surfaces is controlled so the surfaces are substantially smooth, continuous surfaces which are free of edges which generate stress in the deposited film. A further feature of the invention is the use of a material for the line-of-sight and specimen surrounding surfaces which enhances adhesion of the deposited film.

The apparatus of the invention includes a plasma shield and a specimen surrounding surface. The plasma shield comprises a member having a line-of-sight surface thereon. The member includes means for controlling the deposition quality of the line-of-sight surface to improve the adhesion of a film formed thereon when the plasma shield is mounted in a reaction chamber of a plasma-enhanced CVD apparatus and a film is deposited on a specimen in the reaction chamber as a result of a reaction with plasma gas. The member further includes means for mounting the member in a plasma-enhanced CVD apparatus so that a plasma reaction region is located between the line-of-sight surface and a specimen mounted for treatment in the reaction chamber.

In a preferred embodiment, the plasma shield comprises a member having a plasma extracting bore extending therethrough, the bore being defined by a line-of-sight surface on the member. Regulating means is provided for maintaining the line-of-sight surface at a substantially constant temperature. The member also includes means for mounting the member in a chemical vapor deposition apparatus so that plasma passes from a plasma chamber, through the bore and into a reaction chamber of the apparatus. The member can include a horn extending from an outlet end of the bore. The member can also include gas ejection means for ejecting gas into the bore, the gas ejection means comprising a plurality of orifices spaced apart in a circumferential direction around the member. The orifices can be oriented such that the gas is ejected in a downstream direction with respect to the direction of movement of plasma through the bore. The horn can also include cut-out means extending radially through an outer periphery of the horn for allowing a specimen to be moved therethrough.

The specimen surrounding surface comprises a member having a specimen surrounding surface which comes into contact with a plasma gas when the specimen surrounding surface is mounted in a reaction chamber of a plasma-enhanced CVD apparatus. The member includes means for controlling deposition quality of the specimen surrounding surface to improve adhesion of a film formed thereon when the specimen surrounding surface is mounted in the reaction chamber and a film is deposited on a specimen mounted on a specimen-supporting surface in the reaction chamber as a result of a reaction with plasma gas. The member further includes means for mounting the member in the reaction chamber so that the specimen surrounding surface surrounds the specimen-supporting surface and so that the member does not thermally affect a temperature of the specimen-supporting surface when the plasma gas contacts the specimen surrounding surface and the specimen-supporting surface.

In a preferred embodiment, the specimen surrounding surface comprises a member having a specimen surrounding surface which comes in direct contact with a plasma stream. Regulating means is provided for maintaining the specimen surrounding surface at a substantially constant temperature. The member includes means for mounting the member in a reaction chamber of a CVD apparatus so that the specimen surrounding surface surrounds a specimen-supporting surface in the reaction chamber and so that the member does not thermally affect a temperature of the specimen-supporting surface when a plasma stream simultaneously contacts the specimen surrounding surface and the specimen-supporting surface.

BRIEF DESCRIPTION OF THE DRAWING

The invention will now be described with reference to the accompanying drawing, in which:

FIG. 2 shows a plasma shield in accordance with the invention;

FIG. 3 shows a modification of the plasma shield shown in FIG. 2;

DETAILED DESCRIPTION OF THE PREFERRED EMBODIMENTS

Figure 1A:
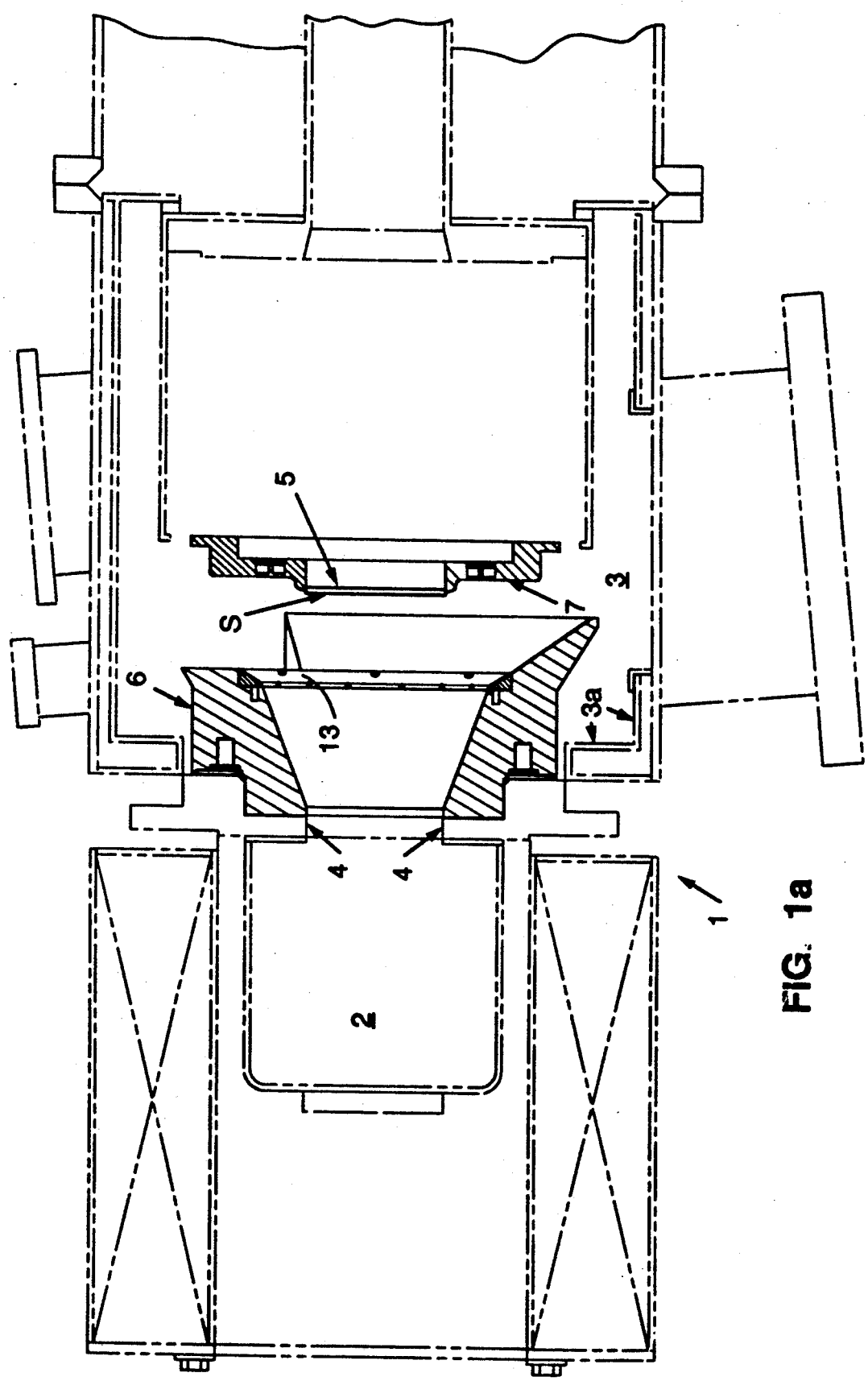
FIG. 1a shows one embodiment of a plasma-enhanced CVD apparatus in accordance with the invention.

The invention provides a method and apparatus for improving the adhesion and the integrity of a deposited film on line-of-sight and specimen surrounding surfaces in a plasma-enhanced CVD apparatus. In particular, deposition quality of line-of-sight and specimen surrounding surfaces can be controlled in accordance with the invention.

According to one aspect of the invention, the line-of-sight and specimen surrounding surfaces are maintained at a substantially constant temperature during a step of depositing a film on a specimen such as a silicon specimen. As a result, differential thermal expansion between the deposited film and the base material is avoided, thereby minimizing stresses in the deposited film. By improving the adhesion of the film, the deposited film is less likely to crack and flake off, thereby minimizing particle generation and reducing the amount of particles on the specimen.

According to another aspect of the invention, the geometry of the line-of-sight and specimen surrounding surfaces is controlled to eliminate edges which would generate stress in the deposited film. According to a further aspect of the invention, the line-of-sight and specimen surrounding surfaces are formed of a material which provides strong adhesion to the deposited film.

The line-of-sight and specimen surrounding surfaces can be maintained at any substantially constant temperature. According to a preferred embodiment, however, these surfaces are maintained at ambient temperature. As a result, when the apparatus is not in use or being serviced, such that the surfaces in the reaction chamber are at ambient temperature, differential thermal expansion of the film and of the line-of-sight and specimen surrounding surfaces is minimized. Alternatively, the line-of-sight and specimen surrounding surfaces can be maintained at an elevated temperature, such as at least 300° C. However, these surfaces could also be maintained at a temperature below ambient temperature.

According to a further aspect of the invention, the line-of-sight and specimen surrounding surfaces can be conditioned prior to the depositing step. The conditioning step comprises eliminating adsorbed layers on the line-of-sight and specimen surrounding surfaces which tend to reduce adhesion of the film thereon. For instance, the conditioning step can comprise contacting these surfaces with oxygen plasma, argon plasma, or a combination of oxygen and argon plasma.

According to the invention, it has been determined that $SiO_2$ film has good adhesion to bare aluminum. Accordingly, the line-of-sight and specimen surrounding surfaces can comprise exposed aluminum surfaces in order to obtain good adhesion of the first deposited film. In addition, before each deposition, oxygen or argon or a combination of oxygen and argon plasma can be used to condition the line-of-sight and specimen surrounding surfaces. It is believed that such a conditioning treatment eliminates adsorbed layers which tend to reduce film adhesion.

According to another aspect of the invention, specially designed components are provided for improving the quality of a film deposited on a specimen. According to one feature of the invention, such components include regulating means for maintaining the line-of-sight and specimen surrounding surfaces at a substantially constant temperature. According to a second feature of the invention, sharp edges and corners are avoided in the line-of-sight and specimen surrounding surfaces. According to a third feature of the invention, these surfaces can be made of a material, such as exposed aluminum, which provides strong adhesion of the deposited film. By combining two or all three of these features, it is possible to maximize film integrity and adhesion to the line-of-sight and specimen surrounding surfaces.

The regulating means can be used to limit thermal cycling of the line-of-sight and specimen surrounding surfaces to ±5° C. during thermal cycling of the CVD apparatus due to plasma on/off cycles. For instance, the regulating means can comprise fluid passages in components having line-of-sight and specimen surrounding surfaces to maintain such surfaces at room temperature, thereby limiting thermal cycling to ambient temperature when removing parts from the apparatus. Alternatively, these surfaces can be maintained at a high temperature of 300°-400° C. Furthermore, such surfaces can comprise exposed surfaces of aluminum or aluminum alloys, nickel or nickel alloys, stainless steel or molybdenum. Such surfaces can also be provided with different surface treatments, such as a sandblasted surface finish.

FIG. 1a shows plasma-enhanced ECR CVD apparatus 1 in accordance with one embodiment of the invention. As shown, treated surface S of a semiconductor specimen is held in a vertical orientation on specimen-supporting surface 5 located in reaction chamber 3. Specimen-supporting surface 5 is movable in a horizontal direction toward and away from plasma chamber 2. Plasma generated in plasma chamber 2 passes through aperture 4 in a plasma aperture ring and forms a plasma reaction region adjacent specimen-supporting surface 5.

According to one aspect of the invention, plasma shield 6 is provided which includes at least one line-of-sight surface located inwardly from the inner walls of reaction chamber 3 such that the plasma reaction region is between the line-of-sight surface on plasma shield 6 and a specimen mounted for treatment in the reaction chamber. If the plasma shield is omitted, the inner walls of reaction chamber 3 include line-of-sight surfaces 3a from which a straight line can be drawn directly to the treated surface of the semiconductor specimen.

Plasma shield 6 shown in FIG. 1a has a bore therethrough. However, the line-of-sight surface could be provided on a plasma shield which does not include such a bore. Also, plasma chamber 2 could be omitted, and the plasma could be generated in another manner. For instance, the specimen holder could include means for generating the plasma. In such a case, the line-of-sight surface could be located closely adjacent the plasma reaction region. It would be advantageous, however, to minimize the area of the line-of-sight surface to facilitate cleaning thereof by sputtering treatment.

Figure 1B:
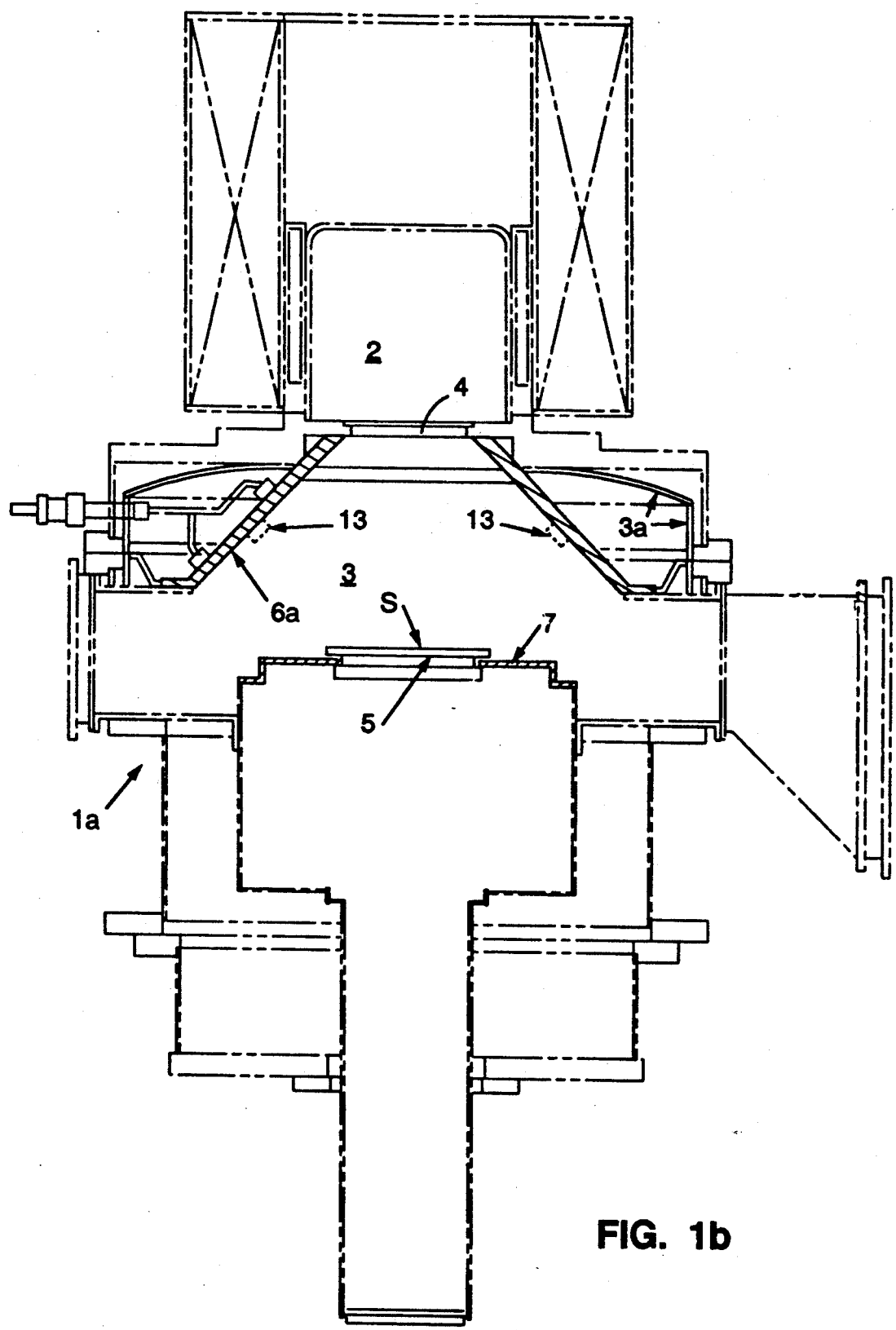
FIG. 1b shows another embodiment of a plasma-enhanced CVD apparatus in accordance with the invention.

FIG. 1b shows another embodiment of a plasma-enhanced ECR CVD apparatus 1a in accordance with the invention. In this case, treated surface S of a semiconductor specimen is held in a horizontal orientation on specimen-supporting surface 5. The specimen-supporting surface is movable in a vertical direction toward and away from plasma chamber 2. As in the embodiment shown in FIG. 1a, plasma generated in plasma chamber 2 passes through aperture 4 of a plasma aperture ring and forms a plasma reaction region adjacent specimen-supporting surface 5. Also, the inner walls of reaction chamber 3 include line-of-sight surfaces 3a.

Plasma shield 6a shown in FIG. 1b differs from plasma shield 6 shown in FIG. 1a in that it forms a removable inner liner at the top of reaction chamber 3. However, plasma shield 6 of FIG. 1a can be used in place of plasma shield 6a, if so desired. In either case, specimen-supporting surface 5 can be located slightly beyond the outer end of the plasma shield (as shown in FIG. 1a), or specimen-supporting surface 5 can be moved such that the specimen is located within the bore of the plasma shield during treatment of the specimen.

The embodiments shown in FIGS. 1a and 1b also include specimen surrounding surface 7. Plasma specimen surrounding 7 includes a specimen surrounding surface which comes into direct contact with a plasma stream during treatment of the specimen.

FIGS. 2–6 show features of plasma shield 6, and FIGS. 7–14 show features of plasma specimen surrounding 7.

Plasma shield 6 comprises member 8 which preferably comprises metal such as aluminum or an aluminum alloy. The member includes bore 9 extending therethrough in an axial direction A, and bore 9 is defined by line-of-sight surface 10 on member 8. The line-of-sight surface can be located closely adjacent the plasma stream passing through bore 9 to minimize area of the line-of-sight surface. However, the line-of-sight surface should not intercept the plasma stream. According to a preferred embodiment of the invention, the line-of-sight surface completely surrounds the plasma stream and diverges from a center of the plasma stream so as to become wider in a direction toward the surface of the specimen.

Plasma shield 6 also includes regulating means for maintaining line-of-sight surface 10 at a substantially constant temperature. Plasma shield 6 also includes means 12 for mounting member 8 in a CVD apparatus so that plasma passes from plasma chamber 2, through bore 9, and into reaction chamber 3 of the apparatus, as shown in FIG. 1a. Plasma shield 6 can include gas ejection means 13 for ejecting gas into or from an outlet end of bore 9.

Plasma shield 6 can include horn 14, as shown in FIG. 3. Bore 9 can be conical with inlet end 15 smaller than outlet end 16 of bore 9. Horn 14 extends from outlet end 16 of the bore. Horn 14 can include conical opening 17 therethrough, opening 17 being tapered such that inlet end 18 thereof is smaller than outlet end 19 thereof. Opening 17 is defined by a line-of-sight surface on the horn 14. That is, the surfaces forming bore 9 and opening 17 directly face a specimen mounted on specimen-supporting surface 5 shown in FIG. 1a when plasma shield 6 is mounted in CVD apparatus 1. Opening 17 can have a greater tapered angle than bore 9 or opening 17, and bore 9 can be formed by one smooth, continuous rectilinear surface. Alternatively, the line-of-sight surface could be arcuate.

As shown in FIG. 3, horn 14 can include cut-out 20 extending radially between opening 17 and an outer periphery of horn 14 for allowing a specimen to be moved therethrough when the specimen is placed on the specimen-supporting surface. However, cut-out 20 can be omitted, as shown in FIG. 2.

Figure 4:
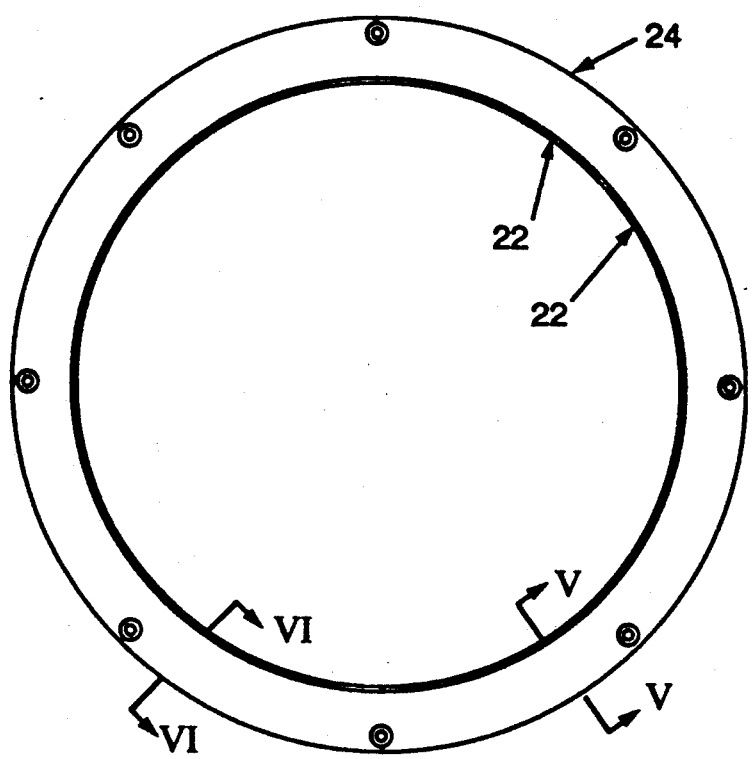
FIG. 4 shows a front view of a gas ejection ring in accordance with the invention.
Figure 6:
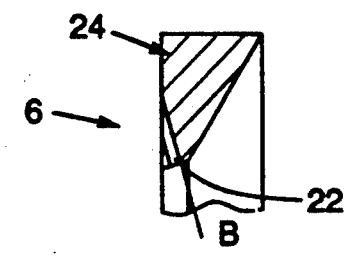
FIG. 6 shows a cross-section taken along line VI—VI in FIG. 4.
Figure 5:
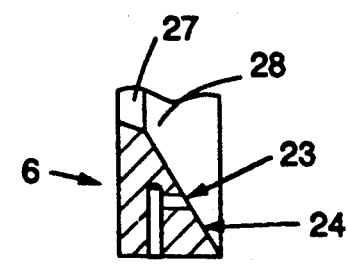
FIG. 5 shows a cross-section taken along line V—V in FIG. 4.
Figure 7:
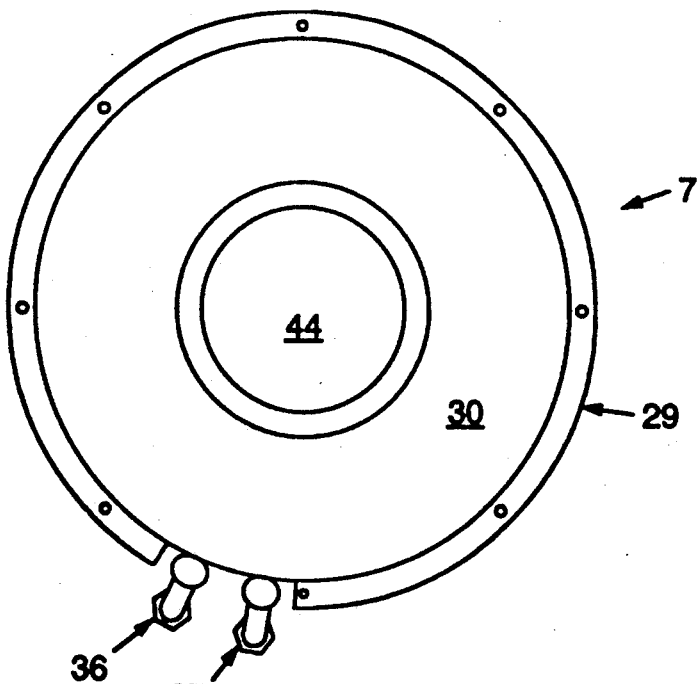
FIG. 7 shows a front view of a specimen surrounding surface in accordance with the invention.
Figure 8:
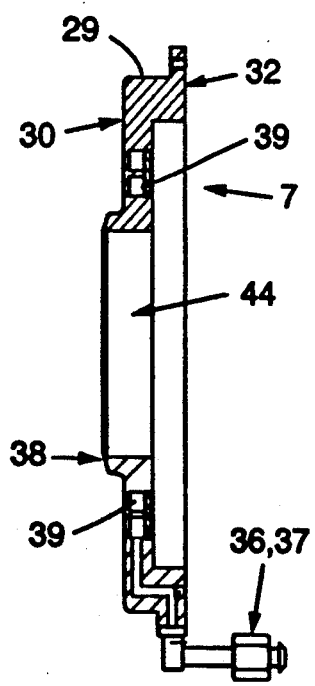
FIG. 8 shows a side view of the specimen surrounding surface shown in FIG. 7.
Figure 9:
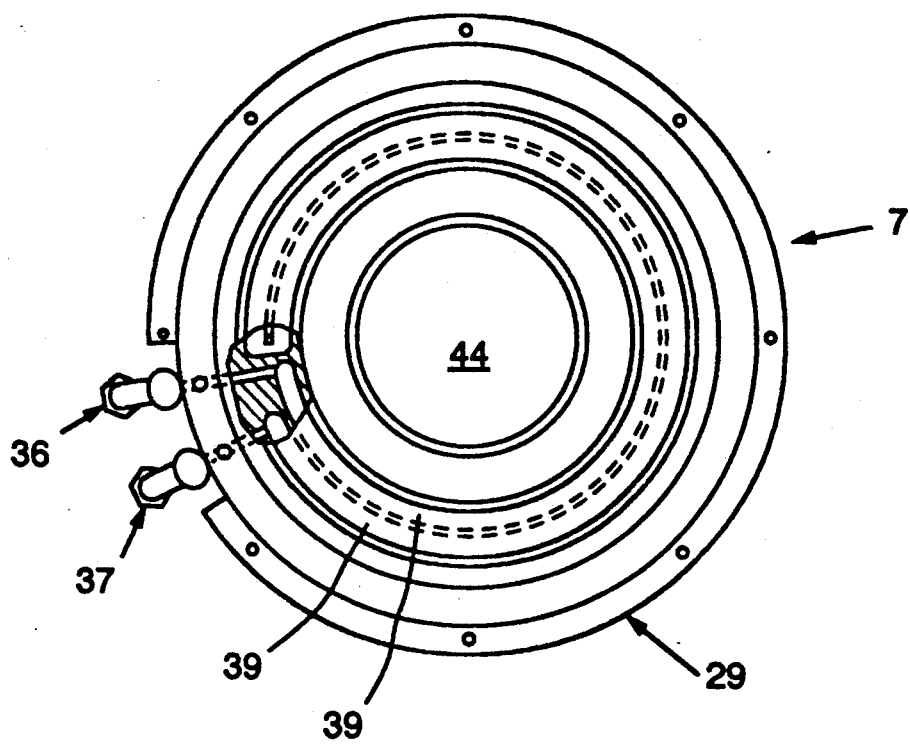
FIG. 9 is a bottom view of the specimen surrounding surface shown in FIG. 7.
Figure 10:
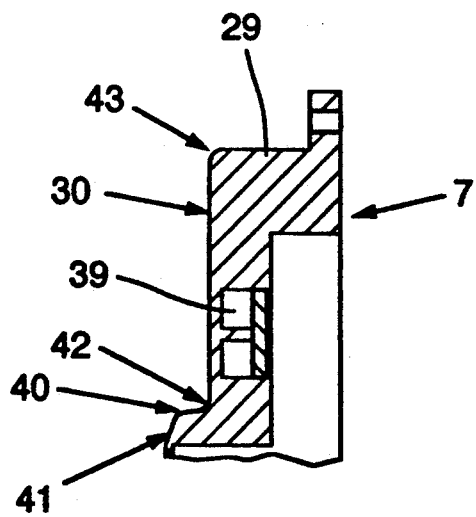
FIG. 10 is a cross-section of part of the specimen surrounding surface shown in FIG. 8.
Figures 11, 12:
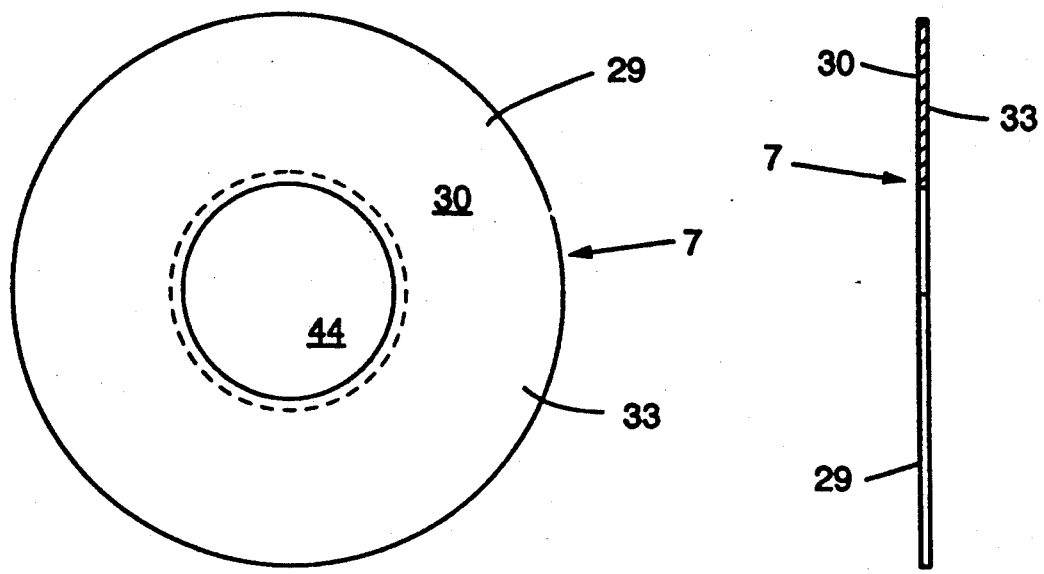
FIG. 11 is a front view of part of a specimen surrounding surface according to another embodiment of the invention.
FIG. 12 is a side view of the part shown in FIG. 11.
Figures 13, 14:
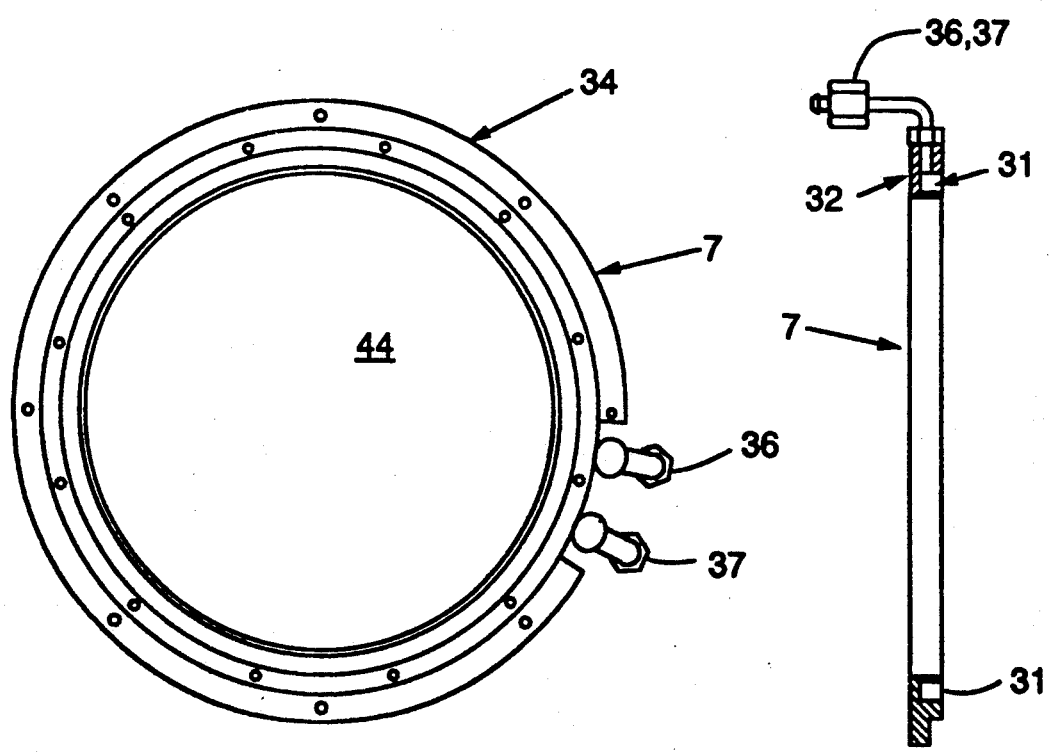
FIG. 13 is a front view of the second part of the specimen surrounding surface shown in FIG. 11.
FIG. 14 is a side view of the part shown in FIG. 13.

Recess 21 can be provided between member 8 and horn 14, as shown in FIG. 3. Gas ejection means 13 can include ring 24 (as shown in FIG. 4) which can be removably mounted in recess 21. Gas ejection means 13 can also include a plurality of orifices 22 spaced apart in a circumferential direction around ring 24. A cross-section taken along the line VI—VI in FIG. 4 of one of the orifices 22 is shown in FIG. 6. Ring 24 can also include temperature probe means 23 (as shown in FIG. 5) comprising a bore for supporting a thermo-couple. A cross-section taken along the line V—V in FIG. 4 of the temperature probe means 23 is shown in FIG. 5.

As shown in FIG. 3, horn 14 can include conical opening 17 which is tapered to a greater extent than conical bore 9. Gas ring 24 can include a first surface 27 which is tapered to the same extent as bore 9, and ring 24 can include a second surface 28 which is tapered to the same extent as opening 17. First surface 27 can be coterminous with the line-of-sight surface defining bore 9, and second surface 28 can be coterminous with the line-of-sight surface defining opening 17. Thus, a smooth surface free of edges which would cause stress in the deposited film is provided through plasma shield 6.

The regulating means comprises a fluid passage 11 in member 8, and a suitable fluid medium, such as water, can be circulated in fluid passage 11 for maintaining the line-of-sight surfaces at a substantially constant temperature. As shown in FIG. 3, fluid passage 11 extends circumferentially around member 8 at a location between the inner and outer peripheries of member 8. The regulating means also includes inlet and outlet means 25 for circulating the fluid medium in fluid passage 11.

Member 8 can include circumferentially extending groove 26 which is spaced radially outwardly from bore 9. Ring 24 can be removably mounted to member 8 such that orifices 22 are in fluid communication with groove 26. Gas ejection means 13 can include a gas supply, as shown in FIG. 2. Accordingly, if oxygen plasma is used in the apparatus, gas ejection means 13 can supply $SiH_4$ in order to deposit an $SiO_2$ film.

As shown in FIG. 6, each of the orifices 22 for ejecting gas can have a central axis B at an outlet end thereof, central axis B being oriented such that gas is ejected from the orifices 22 toward a center axis of bore 9. Central axis B can be inclined with respect to axial direction A such that an end of the orifice 22 facing bore 9 is located further downstream with respect to the direction of movement of plasma through bore 9 than other portions of the orifice. Central axis B can form an angle, such as about 15°, with a plane perpendicular to axial direction A. Central axis B could also be oriented such that the gas is ejected from the orifices 22 in a helical pattern about a center axis of bore 9.

Plasma specimen surrounding surface 7 comprises member 29 having specimen surrounding surface 30, as shown in FIGS. 7-12. Plasma specimen surrounding surface 7 includes regulating means for maintaining specimen surrounding surface 30 at a substantially constant temperature. In addition, specimen surrounding surface 7 includes means 32 for mounting member 29 in a reaction chamber of a CVD apparatus so that specimen surrounding surface 30 surrounds a specimen-supporting surface in the reaction chamber and so that member 29 does not thermally affect a temperature of the specimen-supporting surface when a plasma stream simultaneously contacts specimen surrounding surface 30 and the specimen surface and/or the specimen-supporting surface. Accordingly, specimen surrounding surface 7 can be mounted in the arrangements shown in FIGS. 1a and 1b such that the specimen surrounding surface surrounds specimen-supporting surface 5. In the arrangement shown in FIG. 1a, specimen-supporting surface 5 is oriented vertically. Thus, specimen surrounding surface 7 of the invention will be effective in reducing the amount of deposited film particles which might fall from the upper portion of specimen surrounding surface 7 onto the specimen-supporting surface.

FIGS. 7-10 show one embodiment of specimen surrounding 7, and FIGS. 11-14 show another embodiment of specimen surrounding surface 7. The arrangement shown in FIGS. 7-10 is a one-piece arrangement, whereas the arrangement shown in FIGS. 11-14 is a two-piece arrangement.

As shown in FIGS. 11-14, member 29 can comprise first and second parts, the first part comprising plate 33, specimen surrounding surface 30 comprising a first side of plate 33. The second part comprises annular member 34 mounted to a second side of plate 33. The specimen surrounding surface preferably includes suitable gasket means comprising a material which enhances thermal conduction between plate 33 and annular member 34. For instance, a soft, conformable material such as indium or lead could be used as the gasket means.

The regulating means comprises fluid passage 31 in annular member 34. Fluid passage 31 extends circumferentially around annular member 34 at a location between inner and outer peripheries of annular member 34. The regulating means also includes fluid inlet 36 and fluid outlet 37 in fluid communication with fluid passage 31. Plate 33 shown in FIGS. 11 and 12 can be removably mounted on annular member 34 shown in FIGS. 13 and 14. Plate 33 is preferably mounted such that it is maintained at substantially constant temperature by thermal conduction between a radially outer portion of plate 33 and annular member 34.

In the arrangement shown in FIGS. 7-10, member 29 includes hub 38 extending away from specimen surrounding surface 30. The regulating means can comprise concentric fluid passages 39 extending circumferentially around member 29 at a location between hub 38 and an outer periphery of member 29. The regulating means can also include fluid inlet and fluid outlet means 36 and 37, respectively, in fluid communication with fluid passages 39. To eliminate sharp corners and edges, hub 38 includes cylindrical surface 40 extending perpendicularly from the specimen surrounding surface, and tapered surface 41 extends radially inward of cylindrical surface 40. Tapered surface 41 is closer to a plane containing specimen surrounding surface 30 at points located away from a center axis of hub 38. Cylindrical surface 40 is connected to specimen surrounding surface 30 by a first arcuate surface 42, and an outermost edge of the specimen surrounding surface comprises a second arcuate surface 43.

In both embodiments of specimen surrounding surface 7, member 29 can include opening 44 therethrough, the opening being large enough for a specimen-supporting surface of a specimen-holding chuck to pass therethrough. Thus, in the arrangement shown in FIG. 1, opening 44 would allow a surface of an electrostatic chuck to pass therethrough so as to hold a specimen on a specimen-supporting surface which is coplanar with specimen surrounding surface 30. Alternatively, the specimen could be held such that the specimen-supporting surface of the chuck is coplanar with an edge of tapered surface 41 closest to opening 44. The specimen can be larger in diameter than opening 44 such that the outer periphery of the specimen overlies specimen surrounding surface 30 of plate 33 or is spaced from specimen surrounding surface 30 of the one-piece target shown in FIGS. 7-10.

While the invention has been described with reference to the foregoing embodiments, various changes and modifications can be made thereto which fall within the scope of the appended claims.

What is claimed is:

1. A method of improving the quality of a film deposited on a specimen in a chemical vapor deposition apparatus through minimization of particle generation in a reaction chamber of the apparatus, comprising:
    a step of generating plasma in a plasma chamber of a chemical vapor deposition apparatus and contacting a surface of a specimen in a reaction chamber of the apparatus with a plasma stream so as to deposit a film thereon; and
    a step of controlling deposition quality of a line-of-sight surface which faces the surface of the specimen to improve adhesion and integrity of a film formed thereon during the depositing step so as to minimize particle generation in the reaction chamber, the line-of-sight surface completely surrounding the plasma stream and diverging from a center of the plasma stream so as to become wider in a direction towards the surface of the specimen, the controlling step comprising maintaining the line-of-sight surface at a substantially constant temperature.

2. The method of claim 1, further comprising controlling deposition quality of a specimen surrounding surface which surrounds the specimen and is contacted by the plasma to improve adhesion and integrity of a film formed thereon during the depositing step so as to minimize particle generation in the reaction chamber, the controlling step comprising maintaining the specimen surrounding surface at a substantially constant temperature.

3. The method of claim 2, wherein the controlling step comprises maintaining the line-of-sight and specimen surrounding surfaces at ambient temperature.

4. The method of claim 2, wherein the controlling step comprises maintaining the line-of-sight and specimen surrounding surfaces above ambient temperature.

5. The method of claim 2, wherein the controlling step comprises maintaining the line-of-sight and specimen surrounding surfaces at at least 300° C.

6. The method of claim 2, wherein the controlling step comprises maintaining the line-of-sight and specimen surrounding surfaces below ambient temperature.

7. The method of claim 2, further comprising a step of conditioning line-of-sight specimen surrounding surfaces prior to the depositing step, the conditioning step comprising eliminating adsorbed layers on the line-of-sight and specimen surrounding surfaces which tend to reduce adhesion of the film thereon.

8. The method of claim 7, wherein the conditioning step comprises contacting the line-of-sight and specimen surrounding surfaces with oxygen plasma.

9. The method of claim 7, wherein the conditioning step comprises contacting the line-of-sight and specimen surrounding surfaces with argon plasma.

10. The method of claim 7, wherein the conditioning step comprises contacting the line-of-sight and specimen surrounding surfaces with oxygen and argon plasma.

11. The method of claim 2, wherein the line-of-sight and specimen surrounding surfaces comprise aluminum which improves adhesion of a deposited film thereon.

12. The method of claim 2, wherein the line-of-sight and specimen surrounding surfaces are of a material which improves adhesion of a deposited film thereon and geometry of the line-of-sight and specimen surrounding surfaces is free of edges which cause stress in a deposited film on the line-of-sight and specimen surrounding surfaces.

* * * * *